(12) United States Patent
Fujiwara et al.

(10) Patent No.: US 10,473,445 B2
(45) Date of Patent: Nov. 12, 2019

(54) INDIUM PHOSPHIDE SUBSTRATE, METHOD OF INSPECTING INDIUM PHOSPHIDE SUBSTRATE, AND METHOD OF PRODUCING INDIUM PHOSPHIDE SUBSTRATE

(71) Applicant: Sumitomo Electric Industries, Ltd., Osaka-shi, Osaka (JP)

(72) Inventors: Shinya Fujiwara, Itami (JP); Yasuaki Higuchi, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 186 days.

(21) Appl. No.: 15/541,754

(22) PCT Filed: Dec. 7, 2015

(86) PCT No.: PCT/JP2015/084273
§ 371 (c)(1),
(2) Date: Jul. 6, 2017

(87) PCT Pub. No.: WO2016/129172
PCT Pub. Date: Aug. 18, 2016

(65) Prior Publication Data
US 2017/0363406 A1    Dec. 21, 2017

(30) Foreign Application Priority Data
Feb. 9, 2015  (JP) ................................. 2015-023050

(51) Int. Cl.
*G01B 5/28* (2006.01)
*H01L 29/34* (2006.01)
(Continued)

(52) U.S. Cl.
CPC ................ *G01B 5/28* (2013.01); *B24B 37/08* (2013.01); *B24B 37/10* (2013.01); *B24B 37/105* (2013.01);
(Continued)

(58) Field of Classification Search
CPC .......... G01B 5/28; G01B 5/285; C30B 29/40; H01L 21/02013; H01L 21/02024;
(Continued)

(56) References Cited

U.S. PATENT DOCUMENTS

2007/0075041 A1   4/2007   Ishibashi et al.
2007/0269989 A1  11/2007   Nishiura et al.
2013/0032822 A1   2/2013   Ishibashi

FOREIGN PATENT DOCUMENTS

CN   101075570 A   11/2007
CN   103608899 A    2/2014
(Continued)

*Primary Examiner* — Paul M. West
(74) *Attorney, Agent, or Firm* — Drinker Biddle & Reath LLP

(57) ABSTRACT

An indium phosphide substrate, a method of inspecting thereof and a method of producing thereof are provided, by which an epitaxial film grown on the substrate is rendered excellently uniform, thereby allowing improvement in PL characteristics and electrical characteristics of an epitaxial wafer formed using this epitaxial film. The indium phosphide substrate has a first main surface and a second main surface, a surface roughness Ra1 at a center position on the first main surface, and surface roughnesses Ra2, Ra3, Ra4, and Ra5 at four positions arranged equidistantly along an outer edge of the first main surface and located at a distance of 5 mm inwardly from the outer edge. An average value m1 of the surface roughnesses Ra1, Ra2, Ra3, Ra4, and Ra5 is 0.5 nm or less, and a standard deviation σ1 of the surface roughnesses Ra1, Ra2, Ra3, Ra4, and Ra5 is 0.2 nm or less.

3 Claims, 4 Drawing Sheets

(51) Int. Cl.
    *B24B 37/08*   (2012.01)
    *B24B 37/10*   (2012.01)
    *C30B 33/00*   (2006.01)
    *G01Q 60/24*   (2010.01)
    *H01L 21/02*   (2006.01)
    *H01L 29/20*   (2006.01)
    *B24B 57/02*   (2006.01)
    *C30B 25/20*   (2006.01)
    *C30B 29/40*   (2006.01)
    *H01L 33/00*   (2010.01)
    *C30B 11/00*   (2006.01)

(52) U.S. Cl.
    CPC .............. *B24B 57/02* (2013.01); *C30B 25/20* (2013.01); *C30B 29/40* (2013.01); *C30B 33/00* (2013.01); *G01B 5/285* (2013.01); *G01Q 60/24* (2013.01); *H01L 21/02008* (2013.01); *H01L 21/02013* (2013.01); *H01L 21/02016* (2013.01); *H01L 21/02024* (2013.01); *H01L 29/20* (2013.01); *H01L 29/34* (2013.01); *C30B 11/00* (2013.01); *H01L 21/0243* (2013.01); *H01L 21/02392* (2013.01); *H01L 21/02461* (2013.01); *H01L 33/0062* (2013.01)

(58) Field of Classification Search
    CPC ....... H01L 29/34; B24B 37/08; B24B 37/105; B24B 37/10; B24B 57/02
    See application file for complete search history.

(56) References Cited

FOREIGN PATENT DOCUMENTS

| | | |
|---|---|---|
| JP | S63-76413 A | 4/1988 |
| JP | 2001-102337 A | 4/2001 |
| JP | 2003-218033 A | 7/2003 |
| JP | 2003-257899 A | 9/2003 |
| JP | 3456254 B | 10/2003 |
| JP | 2007-103463 A | 4/2007 |
| JP | 2007-234952 A | 9/2007 |
| JP | 2007-311490 A | 11/2007 |
| JP | 2008-198855 A | 8/2008 |
| JP | 2010-248050 A | 11/2010 |
| JP | 5370393 B | 12/2013 |
| JP | 2014-157979 A | 8/2014 |
| JP | 2015-126003 A | 7/2015 |

(a)

(b)

INDIUM PHOSPHIDE SUBSTRATE, METHOD OF INSPECTING INDIUM PHOSPHIDE SUBSTRATE, AND METHOD OF PRODUCING INDIUM PHOSPHIDE SUBSTRATE

TECHNICAL FIELD

The present invention relates to an indium phosphide substrate, a method of inspecting an indium phosphide substrate, and a method of producing an indium phosphide substrate.

BACKGROUND ART

Since indium phosphide (InP) substrates have light emitting characteristics and allow higher electron mobility, such substrates are widely used in a semiconductor laser diode (LD), a light emitting diode (LED), a high-speed device, or the like. According to a semiconductor LD and an LED, after an epitaxial film is formed on an InP substrate, the PL intensity is measured. In this way, the light emitting performance can be inspected in a simple manner. It is preferable that this PL light emission intensity is stronger. Also in a high-speed device, it is problematic that a leakage occurs due to impurities at the interface between the InP substrate and the epitaxial film. Accordingly, the less the n-type or p-type impurities exist at the interface, the more the electrical characteristics are stabilized.

PTD 1 (Japanese Patent Laying-Open No. 2007-311490) discloses a technique of reducing impurities on the surface of a compound semiconductor substrate by forming the compound semiconductor substrate to have a surface roughness Rms of 0.2 nm or less.

PTD 2 (Japanese Patent Laying-Open No. 2010-248050) discloses a technique of suppressing deteriorations in PL characteristics and electrical characteristics, which occur when an epitaxial layer is formed on a substrate having a surface with an impurity concentration that is lowered by washing an indium phosphide substrate with a sulfuric acid/hydrogen peroxide and a phosphoric acid.

CITATION LIST

Patent Document

PTD 1: Japanese Patent Laying-Open No. 2007-311490
PTD 2: Japanese Patent Laying-Open No. 2010-248050

SUMMARY OF INVENTION

Technical Problem

The technique in PTD 1 (Japanese Patent Laying-Open No. 2007-311490) specifies the surface roughness of a compound semiconductor substrate, but does not specify in-plane variations of the surface roughness. Accordingly, when the compound semiconductor substrate has a large surface area and exhibits in-plane variations of the surface roughness, the impurity concentration on the surface of the substrate cannot be uniformly lowered.

The technique in PTD 2 (Japanese Patent Laying-Open No. 2010-248050) specifies the washing conditions for lowering the impurity concentration on the substrate surface. The impurity concentration on the substrate surface also relates to the surface roughness of the substrate. The surface roughness of the substrate is influenced by the substrate polishing conditions. However, PTD 2 (Japanese Patent Laying-Open No. 2010-248050) fails to disclose that the surface roughness of the substrate is controlled by the substrate polishing conditions.

The present invention aims to provide an indium phosphide substrate, a method of inspecting an indium phosphide substrate, and a method of producing an indium phosphide substrate, by which the roughness on each of the front and back surfaces of a substrate is controlled, to achieve an excellently uniform epitaxial film grown on the substrate, thereby allowing improvement in PL characteristics of an epitaxial wafer formed using this epitaxial film.

Solution to Problem

An indium phosphide substrate according to one embodiment of the present invention is provided as (I) an indium phosphide substrate having a first main surface and a second main surface. The first main surface has a surface roughness Ra1 at a center position and surface roughnesses Ra2, Ra3, Ra4, and Ra5 at four positions, the four positions being arranged equidistantly along an outer edge of the first main surface and located at a distance of 5 mm inwardly from the outer edge. An average value m1 of surface roughnesses Ra1, Ra2, Ra3, Ra4, and Ra5 is 0.4 nm or less. A standard deviation σ1 of the surface roughnesses Ra1, Ra2, Ra3, Ra4, and Ra5 is 10% or less of the average value m1. The second main surface has a surface roughness Ra6 at a center position and surface roughnesses Ra7, Ra8, Ra9, and Ra10 at four positions, the four positions being arranged equidistantly along an outer edge of the second main surface and located at a distance of 5 mm inwardly from the outer edge. An average value m2 of the surface roughnesses Ra6, Ra7, Ra8, Ra9, and Ra10 is 0.2 nm or more and 3 nm or less. A standard deviation σ2 of the surface roughnesses Ra6, Ra7, Ra8, Ra9, and Ra10 is 10% or less of the average value m2.

(2) It is preferable that the indium phosphide substrate has a maximum diameter of 150 mm or more.

(3) A method of inspecting an indium phosphide substrate according to one embodiment of the present invention is provided. The method includes measuring a surface roughness of an indium phosphide substrate using an atomic force microscope in a view of 1 μm square at a 0.4-nm pitch. The surface roughness is measured at a center position on a main surface of the indium phosphide substrate and at four positions on the main surface that are arranged equidistantly along an outer edge of the main surface and located at a distance of 5 mm inwardly from the outer edge.

(4) A method of producing an indium phosphide substrate according to one embodiment of the present invention is provided as a method of producing an indium phosphide substrate according to the above-described (1) or (2). The method includes: preparing an indium phosphide wafer having a first main surface and a second main surface; double-side polishing the first main surface and the second main surface of the indium phosphide wafer using a first polishing cloth; single-side finish polishing the first main surface of the double-side polished indium phosphide wafer using a second polishing cloth; and washing the single-side finish polished indium phosphide wafer.

Advantageous Effects of Invention

According to the above-described embodiments, an indium phosphide substrate, a method of inspecting an indium phosphide substrate and a method of producing an indium phosphide substrate can be provided, by which the roughness on each of the front and rear surfaces of a substrate is controlled to achieve an excellently uniform epitaxial film grown on the substrate, thereby allowing improvement in PL characteristics of the epitaxial wafer formed using this epitaxial film.

DESCRIPTION OF EMBODIMENTS

Figure 1:
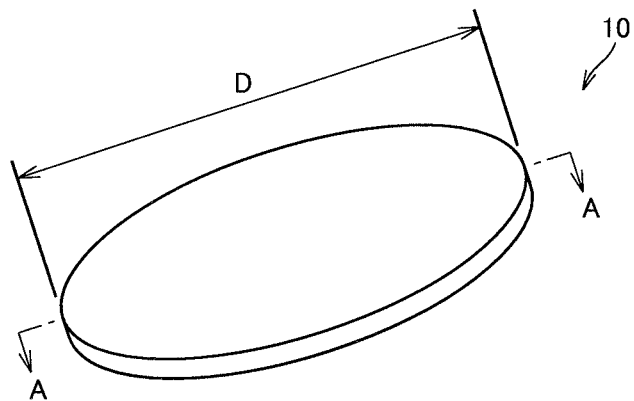
FIG. 1 is a perspective schematic diagram showing an indium phosphide substrate according to one embodiment of the present invention.

Description of Embodiments of the Present Invention

Embodiments of the present invention will be first described as listed below. In the present specification, an individual orientation is represented by [ ], a group orientation is represented by < >, an individual plane is represented by ( ) and a group plane is represented by { }. In addition, a negative index is supposed to be crystallographically indicated by putting "-" (bar) above a numeral, but is indicated by putting the negative sign before the numeral in the present specification.

An indium phosphide substrate according to one embodiment of the present invention is provided as (1) an indium phosphide substrate having a first main surface and a second main surface. The first main surface has a surface roughness Ra1 at a center position and surface roughnesses Ra2, Ra3, Ra4, and Ra5 at four positions, the four positions being arranged equidistantly along an outer edge of the first main surface and located at a distance of 5 mm inwardly from the outer edge. An average value m1 of surface roughnesses Ra1, Ra2, Ra3, Ra4, and Ra5 is 0.4 nm or less. A standard deviation σ1 of surface roughnesses Ra1, Ra2, Ra3, Ra4, and Ra5 is 10% or less of average value m1. The second main surface has a surface roughness Ra6 at a center position and surface roughnesses Ra7, Ra8, Ra9, and Ra10 at four positions, the four positions being arranged equidistantly along an outer edge of the second main surface and located at a distance of 5 mm inwardly from the outer edge. An average value m2 of surface roughnesses Ra6, Ra7, Ra8, Ra9, and Ra10 is 0.2 nm or more and 3 nm or less. A standard deviation σ2 of surface roughnesses Ra6, Ra7, Ra8, Ra9, and Ra10 is 10% or less of average value m2. In this case, the four positions arranged equidistantly along the outer edge of the first main surface and located at a distance of 5 mm inwardly from the outer edge correspond to four positions that are arranged equidistantly along the outer edge of the first main surface and located at a distance of 5 mm inwardly from the outer edge, and also correspond to four positions that are arranged at every 90° with respect to an orientation flat direction (in the [0-1-1] direction on the condition that the main surface of a crystal is defined as (100)).

According to the above-described indium phosphide substrate, the average value of the surface roughnesses on the first main surface is small and the surface roughnesses across the entire first main surface are less in variation. Accordingly, the surface roughness on the first main surface of the substrate is controlled to cause an excellently uniform epitaxial film to grow on the first main surface, thereby allowing improvement in PL characteristics of the epitaxial film.

According to the above-described indium phosphide substrate, the average value of the surface roughnesses on the second main surface is small and the surface roughnesses across the entire second main surface are less in variation. Accordingly, in the step of forming an epitaxial film on the first main surface of the substrate, it becomes possible to suppress that the contact state between a susceptor supporting the substrate and the second main surface of the substrate is locally changed. This can therefore suppress occurrence of a problem that the temperature distribution on the substrate becomes unbalanced as the contact state is changed, with the result that an epitaxial film having an excellent film quality can be formed.

(2) It is preferable that the indium phosphide substrate has a maximum diameter of 150 mm or more.

According to the indium phosphide substrate in the above-described (1), the surface roughnesses on each of the first main surface and the second main surface are controlled across each of the entire main surfaces. Accordingly, even if this indium phosphide substrate has a large diameter with the maximum diameter of 150 mm or more, a uniform epitaxial film can be formed on the substrate surface. Also in such a configuration, when the substrate having a large area is employed, the number of semiconductor elements (chips) that can be formed on the substrate can be increased. Consequently, the producing cost in the step of forming a semiconductor element (device step) can be reduced while the productivity can be improved.

The method of inspecting an indium phosphide substrate according to one embodiment of the present invention is provided as (3) a method of inspecting an indium phosphide substrate. The method includes measuring a surface roughness of an indium phosphide substrate using an atomic force microscope in a view of 1 μm square at a 0.4-nm pitch. The surface roughness is measured at a center position on a main surface of the indium phosphide substrate and at four positions on the main surface that are arranged equidistantly along an outer edge of the main surface and located at a distance of 5 mm inwardly from the outer edge.

The surface roughness is measured at a 0.4-nm pitch using an atomic force microscope (AFM), so that projections and depressions in atomic order can be reliably detected. Furthermore, the surface roughness is measured at a total of five positions including a center position on the main surface and four positions on the outer edge of the main surface, so that the variations in surface roughness on the entire main surface of the substrate can be calculated. Thereby, a substrate having a main surface on which an epitaxial film can be uniformly formed can be selected. Also, the selection cost can be reduced by using the existing AFM.

The method of producing an indium phosphide substrate according to one embodiment of the present invention is provided as (4) a method of producing an indium phosphide substrate according to the above-described (1) or (2). The method includes: preparing an indium phosphide wafer having a first main surface and a second main surface; double-side polishing the first main surface and the second main surface of the indium phosphide wafer using a first polishing cloth; single-side finish polishing the first main surface of the double-side polished indium phosphide wafer using a second polishing cloth; and washing the single-side finish polished indium phosphide wafer.

According to the above, each of the average value of the surface roughnesses and the variations in the surface roughnesses on the first and second main surfaces of the substrate can be controlled to fall within a desired range.

Details of Embodiments of the Present Invention

The following is an explanation with reference to the accompanying drawings about specific examples of an indium phosphide substrate, a method of inspecting an indium phosphide substrate and a method of producing an indium phosphide substrate according to embodiments of the present invention. In the accompanying drawings, the same or corresponding components are designated by the same reference characters, and description thereof will not be repeated.

First Embodiment

Figure 2:
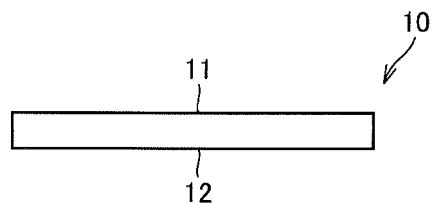
FIG. 2 is a cross-sectional view of the indium phosphide substrate in FIG. 1 taken along a line A-A.
Figure 3:
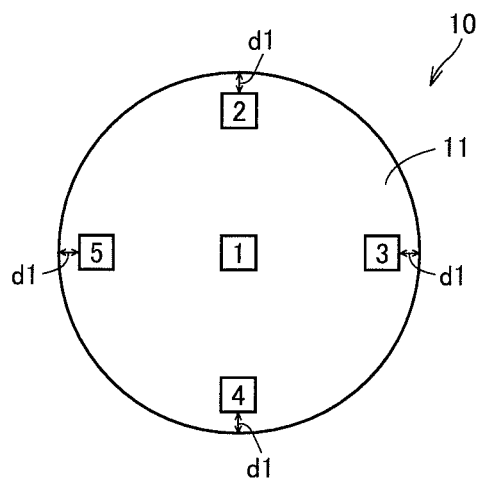
FIG. 3 is a plan view of the indium phosphide substrate according to one embodiment of the present invention as seen from the first main surface side.
Figure 4:
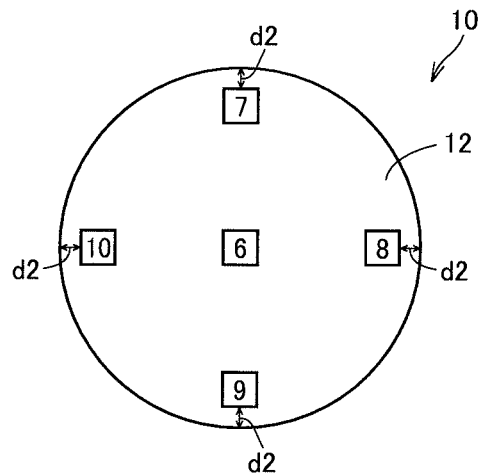
FIG. 4 is a plan view of the indium phosphide substrate according to one embodiment of the present invention as seen from the second main surface side.

An indium phosphide substrate in one embodiment of the present invention will be hereinafter described with reference to FIGS. 1 to 4. FIG. 1 is a perspective schematic diagram showing an indium phosphide substrate 10 according to one embodiment of the present invention. FIG. 2 is a cross-sectional view of indium phosphide substrate 10 in FIG. 1 taken along a line A-A. FIG. 3 is a plan view of indium phosphide substrate 10 as seen from a first main surface 11. FIG. 4 is a plan view of indium phosphide substrate 10 as seen from a second main surface 12.

Indium phosphide substrate (hereinafter also referred to as an InP substrate) 10 is made of a single crystal of indium phosphide (InP). As shown in FIG. 1, InP substrate 10 has an approximately circular shape in a plan view. As shown in FIG. 2, MP substrate 10 includes a first main surface 11 and a second main surface 12. First main surface 11 and second main surface 12 are approximately parallel to each other. For growing an epitaxial film using an InP substrate, an epitaxial film is grown on first main surface 11. In this case, second main surface 12 is placed in contact with a susceptor of a film forming apparatus.

First main surface 11 has a surface roughness Ra1 at its center position and surface roughnesses Ra2, Ra3, Ra4, and Ra5 at its four positions, the four positions being arranged equidistantly along an outer edge of first main surface 11 and located at a distance of 5 mm inwardly from the outer edge. An average value m1 of surface roughnesses Ra1, Ra2, Ra3, Ra4, and Ra5 is 0.4 nm or less. A standard deviation σ1 of surface roughnesses Ra1, Ra2, Ra3, Ra4, and Ra5 is 10% or less of average value m1.

In this case, the surface roughness refers to an arithmetic mean roughness Ra defined under JIS B 0601, and it is defined as a value calculated by extracting a reference length from a roughness curve in a direction of an average line thereof and summing and averaging distances from the average line of this extracted segment to a measurement curve (an absolute value of a deviation).

Surface roughness Ra1 at the center position on first main surface 11 shows a value measured by the following method. First, a view of 1 μm square is extracted from first main surface 11 so as to include a center point of main surface 11 like a region indicated by a reference numeral 1 and surrounded by a square shape in FIG. 3. Surface roughness Ra1 in this extracted range is measured at a 0.4-nm pitch using an atomic force microscope.

Four positions arranged equidistantly along the outer edge of the first main surface and located at a distance of 5 mm inwardly from the outer edge represent four regions as indicated by reference numerals 2 to 5 each of which is surrounded by a square shape in FIG. 3. These four regions are located at a distance of 5 mm (shown by d1 in FIG. 3) inwardly, toward the center of the first main surface, from the positions on the outer edge of the first main surface at which the outer edge is divided into quarters. Surface roughnesses Ra2, Ra3, Ra4, and Ra5 at these four positions indicate values measured by the following method. From first main surface 11, a view of 1 μm square is extracted so as to include these four positions. Then, each of surface roughnesses Ra2, Ra3, Ra4, and Ra5 in these extracted ranges is measured at a 0.4-nm pitch using an atomic force microscope.

Although average value m1 of surface roughnesses Ra1, Ra2, Ra3, Ra4, and Ra5 at five positions on the first main surface of the substrate is 0.4 nm or less as described above, this average value m1 is preferably 0.1 nm or more and 0.3 nm or less. When average value m1 of the surface roughnesses is set at 0.4 nm or less, an excellent epitaxial film can be formed on the first main surface of the substrate.

Although standard deviation σ1 of surface roughnesses R1, R2, R3, R4, and R5 at five positions on the first main surface of the substrate is 10% or less of average value m1, this standard deviation σ1 is preferably 8% or less, and further preferably 6% or less. In this way, when standard deviation σ1 is set at 10% or less of average value m1, the surface roughness on the first main surface of the substrate is controlled so that a uniform epitaxial film can be formed on the substrate surface.

Second main surface 12 has a surface roughness Ra6 at its center position and surface roughnesses Ra7, Ra8, Ra9, and Ra10 at four positions that are arranged equidistantly along the outer edge of the second main surface and located at a distance of 5 mm inwardly from the outer edge. It is preferable that an average value m2 of surface roughnesses Ra6, Ra7, Ra8, Ra9, and Ra10 is 0.2 nm or more and 3 nm or less, and a standard deviation σ2 of surface roughnesses Ra6, Ra7, Ra8, Ra9, and Ra10 is 10% or less of average value m2. In this way, in InP substrate 10 for which the surface roughness is controlled also for second main surface 12 in addition to first main surface 11, when an epitaxial film is grown on first main surface 11, the contact state between second main surface 12 and the susceptor of the film forming apparatus on which InP substrate 10 is mounted can be rendered uniform over the entire second main surface 12. Accordingly, it becomes possible to suppress occurrence of the temperature distribution on InP substrate 10 resulting from occurrence of local variations in the contact state. Thus, the uniformity of the film quality such as crystallinity and impurity concentration of the formed epitaxial film can be improved. Consequently, the yield of the epitaxial film can be improved.

Surface roughness Ra6 at the center position on second main surface 12 indicates a value measured by the following method. From second main surface 12, a view of 1 μm square is extracted so as to include a center point on second main surface 12, like a region indicated by a reference numeral 6 and surrounded by a square in FIG. 4. Then, surface roughness Ra6 in this extracted range is measured at a 0.4-nm pitch using an atomic force microscope.

Four positions arranged equidistantly along the outer edge of the second main surface and located at a distance of 5 mm inwardly from the outer edge represent four regions as indicated by reference numerals 7 to 10 each of which is surrounded by a square shape in FIG. 4. These four regions are located at a distance of 5 mm (shown by d2 in FIG. 4) inwardly, toward the center of the second main surface, from the positions on the outer edge of the second main surface at which the outer edge is divided into quarters. Surface roughnesses Ra7, Ra8, Ra9, and Ra10 at these four positions indicate values measured by the following method. From second main surface 12, a view of 1 μm square is extracted so as to include these four positions. Then, each of surface roughnesses Ra7, Ra8, Ra9, and Ra10 in these extracted ranges is measured at a 0.4-nm pitch using an atomic force microscope.

Average value m2 of surface roughnesses Ra6, Ra7, Ra8, Ra9, and Ra10 at five positions on the second main surface of the substrate is 0.2 nm or more and 3 nm or less, and preferably 0.4 nm or more and 3 nm or less, and further more preferably 0.5 nm or more and 2 nm or less. In addition, when average value m2 of the surface roughnesses on the second main surface exceeds 3 nm, local changes (variations) occur in the contact state between the susceptor and the second main surface of the substrate in the step of forming an epitaxial film. Accordingly, the temperature distribution on the substrate becomes uneven, so that the quality of the resulting epitaxial film may deteriorate. Furthermore, in order to set average value m2 of the surface roughnesses on the second main surface to be less than 0.2 nm, an advanced surface treatment is required. Thus, the production cost for a substrate is increased while the productivity in the process of producing a substrate is lowered. For example, by normal polishing using neutral diamond slurry, it is difficult to set average value m2 of the surface roughness on the rear surface of the substrate to be less than 0.2 nm. In this case, it becomes necessary to perform processing such as CMP processing using colloidal silica and chemical components.

Standard deviation σ2 of the surface roughnesses on the second main surface is 10% or less of average value m2, preferably 8% or less, and further preferably 6% or less. In this way, the contact state between the second main surface and the susceptor can be rendered almost uniform over the entire second main surface, with the result that a uniform epitaxial film can be formed on the first main surface.

InP substrate 10 has a diameter D that is preferably 150 mm or more, and more preferably 150 mm or more and 300 mm or less. As to InP substrate 10, the surface roughnesses on the first main surface and the second main surface are controlled over each of the entire main surfaces. Accordingly, even in the case of a large-diameter substrate having the largest diameter of 150 mm or more, a uniform epitaxial growth layer can be formed on the surface of this substrate. Also in this way, when a substrate having a large area is used, the number of semiconductor elements (chips) that can be formed on this substrate can be increased. Consequently, the production cost in the step of forming a semiconductor element (device step) can be reduced while the productivity can be improved.

It is preferable that the thickness of InP substrate 10 is 500 μm or more and 800 μm or less. Accordingly, even if the InP substrate is relatively large in size, the surface roughnesses on the front and rear surfaces are controlled, so that it becomes possible to suppress reduction of the yields in the step of forming an epitaxial layer and the step of producing a semiconductor element.

Second Embodiment

Then, a method of inspecting an indium phosphide substrate in one embodiment of the present invention will be hereinafter described with reference to FIGS. 3 and 4.

The method of inspecting an indium phosphide substrate includes measuring a surface roughness of an indium phosphide substrate using an atomic force microscope in a view of 1 μm square and at a 0.4-nm pitch. This surface roughness is measured at a center position on a main surface of the indium phosphide substrate and at four positions on the main surface that are arranged equidistantly along an outer edge of the main surface and located at a distance of 5 mm inwardly from the outer edge. Specifically, a view of 1 μm square is first extracted at a center position on a main surface of indium phosphide substrate 10 and four positions on the main surface that are arranged equidistantly along an outer edge of the main surface and located at a distance of 5 mm inwardly from the outer edge. In this case, the main surface of InP substrate 10 may be any one of first main surface 11 and second main surface 12. As to the four positions arranged equidistantly along the outer edge of the main surface and located at a distance of 5 mm inwardly from the outer edge, these four regions represent regions as indicated by reference numerals 2 to 5 each of which is surrounded by a square shape in FIG. 3, or regions as indicated by reference numerals 7 to 10 each of which is surrounded by a square shape in FIG. 4. Also, these four regions correspond to regions located at a distance of 5 mm (shown by d1 in FIG. 3 or d2 in FIG. 4) inwardly, toward the center of the main surface, from the positions on the outer edge of the main surface at which the outer edge is divided into quarters. It is to be noted that these four positions correspond to four regions: that are arranged equidistantly along the outer edge of the first or second main surface and located at a distance of 5 mm inwardly from the outer edge; and that are located at every 90° with respect to an orientation flat (the (001) orientation in a crystal). When the indium phosphide substrate is a wafer with a notch, these four positions are located as follows. Specifically, a reference A point is defined as a position located at a distance of 5 mm inwardly from the outer edge of the first or second main surface on a line, which connects the notch and the substrate center, rotated 45° from the notch about the center of the substrate as a rotation axis. Then, a B point, a C point, and a D point are defined as positions that are located at a distance of 5 mm inwardly from the outer edge of the first main surface on a line, which connects the reference A point and the substrate center, rotated at every 90° from the position on the reference A point about the center of the substrate as a rotation axis. The reference A point, the B point, the C point, and the D point are defined as the above-described four positions. When views to be measured are set at a total of five positions, the surface roughness on the entire main surface of the InP substrate can be measured, so that the entire main surface of the InP substrate can be inspected. Furthermore, when the views to be measured are set at five positions, the inspection can be speedily carried out. A view is a 1 μm square in size.

Then, in each of the above-described views, the surface roughness of the InP substrate is measured at a 0.4-nm pitch using an atomic force microscope (AFM) (for example, "Dimension 3000" manufactured by Veeco) or a scanning probe microscope (for example, "Dimension ICON" manufactured by Bruker AXS).

As described above, according to the method of inspecting an InP substrate in the second embodiment, projections and depressions in atomic order can be reliably detected. Furthermore, for the surface of the InP substrate, projections and depressions in atomic order can be measured using an existing atomic force microscope (AFM) or a scanning probe microscope (SPM), which can eliminate the need of additional cost. By evaluating the projections and depressions in atomic order measured by this method, and also evaluating the amount of impurities at the interface between the epitaxial film and the InP substrate by SIMS after an epitaxial growth, it turned out that there is a relation between the impurities at the interface and the projections/depressions in atomic order. By this method, the cost can be reduced while the amount of impurities at the interface between the InP substrate and the epitaxial film grown on the InP substrate can be reduced.

Third Embodiment

Figure 5:
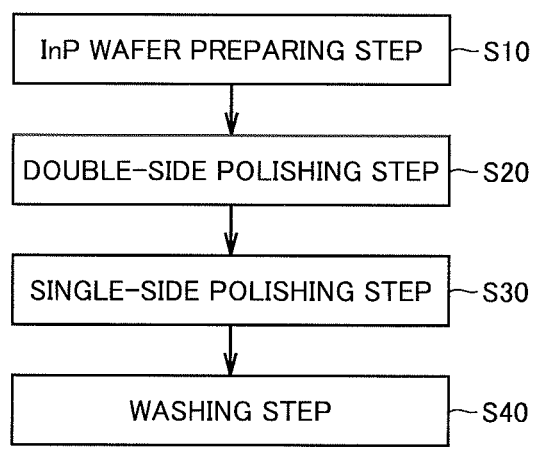
FIG. 5 is a flowchart illustrating a process of producing an indium phosphide substrate according to one embodiment of the present invention.

The method of producing an indium phosphide substrate described in the first embodiment will be hereinafter described with reference to FIG. 5. As shown in FIG. 5, the method of producing an indium phosphide substrate includes: the step of preparing an indium phosphide wafer having a first main surface and a second main surface (S10); the step of double-side polishing the first main surface and the second main surface of the indium phosphide wafer using a first polishing cloth (S20); the step of single-side finish polishing the first main surface of the double-side polished indium phosphide wafer using a second polishing cloth (S30); and the step of washing the single-side finish polished indium phosphide wafer (S40).

In the step of preparing an indium phosphide wafer (hereinafter also referred to as an InP wafer) (S10), an InP ingot is first prepared. This ingot may be made of InP, or may contain a dopant made of at least one kind of substances selected from the group consisting of Fe, S, Sn, and Zn.

Then, the prepared ingot is sliced to obtain an InP wafer. The slicing method is not particularly limited. This InP wafer includes a damage layer caused by such a slicing process.

Then, the first main surface and the second main surface of the InP wafer obtained by slicing is double-side polished using the first polishing cloth (S20). Double-side polishing can be performed, for example, using a double-side polishing apparatus 60 shown in FIG. 6(a). Double-side polishing apparatus 60 includes an upper surface plate 61 that rotationally moves and a lower surface plate 62 that rotationally moves about a rotation axis shared with upper surface plate 61. Also, a first polishing cloth 63 is attached to each of the lower surface of upper surface plate 61 and the upper surface of lower surface plate 62. Furthermore, double-side polishing apparatus 60 includes a wafer carrier 65 configured to hold an InP wafer 66. Wafer carrier 65 is arranged so as to be sandwiched between upper surface plate 61 and lower surface plate 62 and move rotationally about the rotation axis shared with the upper and lower surface plates. Upper surface plate 61 is provided with a polishing liquid introducing hole 64 through which a polishing liquid is supplied from outside onto the polished surface of InP wafer 66. In the double-side polishing step, InP wafer 66 is held at wafer carrier 65 such that the first main surface faces upper surface plate 61 and the second main surface faces lower surface plate 62. It is preferable that the relative speed of upper surface plate 61 to InP wafer 66 is the same as the relative speed of lower surface plate 62 to InP wafer 66.

Figure 6:
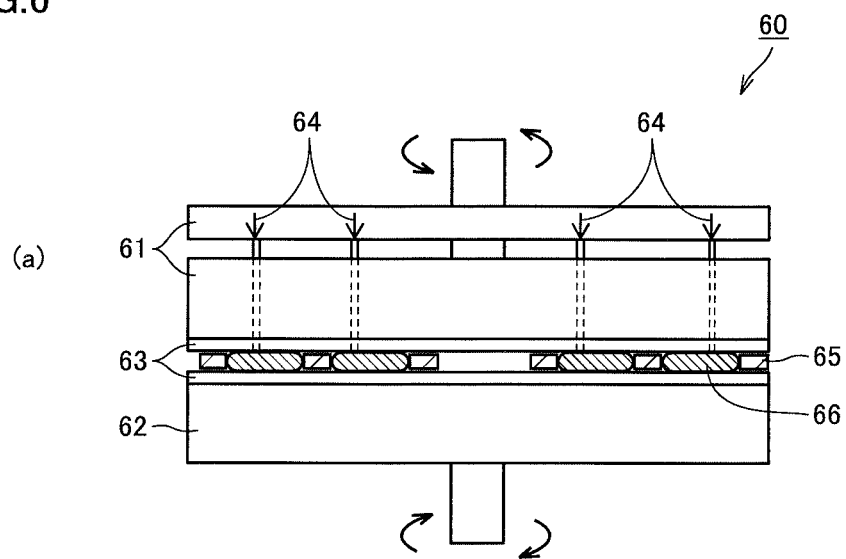
FIG. 6(a) is a schematic diagram of a double-side polishing apparatus, and 6(b) is a schematic plan view of a wafer carrier on which an indium phosphide wafer is placed.
Figure 6:
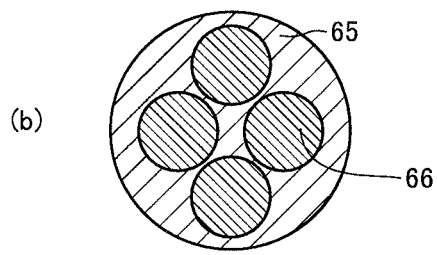

FIG. 6(b) is a schematic plan view showing the state where InP wafer 66 is placed on wafer carrier 65 of the double-side polishing apparatus. As shown in FIG. 6(b), InP wafer 66 is placed inside the holding hole of wafer carrier 65. Wafer carrier 65 is formed such that InP wafer 66 is greater in thickness than wafer carrier 65.

It is preferable that upper surface plate 61 and lower surface plate 62 each are sized to have a diameter of 750 mm or more since the surface flatness of the polished InP wafer is improved. For example, it is preferable to use the first polishing cloth obtained by impregnating a nonwoven fabric base material with a polyurethane resin. In addition, it is preferable that the first polishing cloth is subjected to dressing in advance using diamond pellets before polishing the InP wafer. Thereby, the surface flatness and the surface roughness of the first polishing cloth become uniform. Consequently, the InP substrate polished using the first polishing cloth also exhibits a uniform surface roughness.

As to the conditions for double-side polishing, for example, double-side polishing is performed under the normal conditions until 7/10 of the machining allowance. Then, the rotation speed is lowered to 50% of the normal rotation speed, to lower the polishing rate to 1/3, at which rate the remaining 3/10 of the machining allowance can be double-side polished. As to the normal double-side polishing conditions, for example, the upper surface plate is rotated at a rotation speed of 5 rpm to 10 rpm (forward rotation direction); the lower surface plate is rotated at a rotation speed of 20 rpm to 30 rpm (forward rotation direction); the internal gear is rotated at a rotation speed of 5 rpm to 10 rpm (forward rotation direction); and the sun gear is rotated at a rotation speed of 10 rpm to 15 rpm (forward rotation direction), to apply a load at a surface pressure of 80 g/cm$^2$ to 150 g/cm$^2$, thereby polishing the substrate while supplying a polishing agent (for example, "INSEC IPP" manufactured by Fujimi Incorporated) at a flow rate of 300 ml/min. According to such conditions, the surface roughness of the substrate can be effectively reduced. Thus, the surface roughness on each of the front and rear surfaces of the substrate is controlled. It is preferable that double-side polishing is performed while supplying a polishing liquid and a surface active agent at a fixed flow rate.

It is preferable that the average value of the surface roughnesses on each of the first main surface and the second main surface of the double-side polished InP wafer is 1.0 nm or less. In addition, the average value of the surface roughnesses indicates an average value of the surface roughnesses: at a center position on the main surface of the InP wafer; and at four positions on the main surface that are arranged equidistantly along the outer edge of the main surface and located at a distance of 5 mm inwardly from the outer edge. It is preferable that the standard deviation of these surface roughnesses is 0.1 nm or less. Thereby, the surface roughnesses and the variations thereof on the InP substrate can be readily adjusted to fall within a desired range in the subsequent step.

Figure 7:
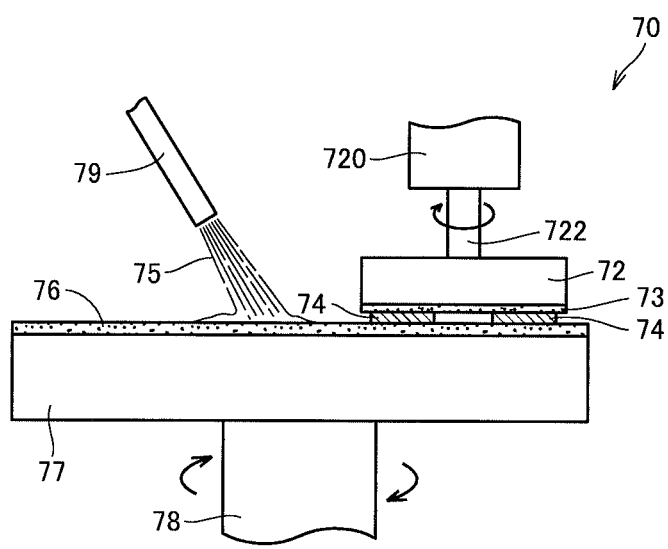
FIG. 7 is a schematic diagram of a single-side polishing apparatus.

Then, the first main surface of the double-side polished wafer is single-side finish polished using the second polishing cloth (S30). This single-side finish polishing can be performed, for example, using a single-side polishing apparatus 70 shown in FIG. 7. Specifically, a plurality of InP wafers 74 are first affixed with wax 73 onto the surface of a polishing plate 72 formed in a circular-plate shape and made of ceramics. Alternatively, a backing film for wafer adsorption is affixed onto the surface of polishing plate 72 formed in a circular-plate shape and made of ceramics, onto which a plurality of InP wafers 74 are affixed with the surface tension of water. Then, a second polishing cloth 76 is affixed onto a polishing surface plate 77 having a diameter of 600 mm or more and formed in a circular-plate shape. Polishing surface plate 77 is supported in a rotatable manner by a rotation shaft 78. Polishing plate 72 is held in a rotatable manner by a shaft 722 that hangs down from a polishing head 720. Above polishing surface plate 77, a polishing liquid supply tube 79 is provided, from which a polishing liquid 75 is supplied onto second polishing cloth 76. Then, polishing surface plate 77 and polishing plate 72 are rotated in the forward direction, thereby polishing InP wafer 74.

It is preferable that a nonwoven fabric-type polishing cloth is used as second polishing cloth 76. As polishing liquid 75, a known polishing agent for InP polishing can be used.

As to the single-side finish polishing conditions, for example, single-side finish polishing is performed under the normal conditions until 9/10 of the machining allowance. Then, the rotation speed is lowered to 50% of the normal rotation speed, to lower the polishing rate to ½, at which rate the remaining 1/10 of the machining allowance can be single-side polished. As to the normal single-side polishing conditions, the lower surface plate is rotated at a rotation speed of 50 rpm to 80 rpm (forward rotation direction); and the upper surface plate is rotated at a rotation speed of 50 rpm to 80 rpm (forward rotation direction), to apply a load at a surface pressure of 40 g/cm$^2$ to 100 g/cm$^2$, thereby polishing the substrate while supplying a polishing agent (for example, "INSEC SP" manufactured by Fujimi Incorporated) at a flow rate of 140 ml/min. According to such conditions, the surface roughness of the substrate can be effectively reduced. Thereby, the surface roughness on each of the front and rear surfaces of the substrate is controlled. It is preferable that single-side finish polishing is performed while supplying a polishing liquid and a surface active agent at a fixed flow rate.

It is preferable that the average value of the surface roughnesses on the first main surface of the InP wafer having been subjected to single-side finish polishing is 0.4 nm or less. The average value of the surface roughnesses indicates an average value of the surface roughnesses: at a center position on the main surface of the InP wafer; and at four positions on the main surface that are arranged equidistantly along the outer edge of the main surface and located at a distance of 5 mm inwardly from the outer edge. It is preferable that the standard deviation of these surface roughnesses is 0.05 nm or less. Thereby, the surface roughnesses and the variations thereof on the InP substrate can be readily adjusted to fall within a desired range in the subsequent step.

Then, the single-side finish polished indium phosphide wafer is washed (S40). Examples of a washing solution can be an acid solution made of at least one of a dilute hydrochloric acid, a dilute sulfuric acid, a dilute nitric acid, and an organic acid. In the washing step, projections and depressions in atomic order on the main surface of the InP wafer are reduced using an acid solution, so that average value m1 of the surface roughnesses on the first main surface of the InP substrate can be set to be 0.4 nm or less.

The acid solution used in the washing step (S40) is at least one of a dilute hydrochloric acid, a dilute sulfuric acid, a dilute nitric acid, and an organic acid. As an organic acid, for example, it is preferable to use a formic acid, an acetic acid, an oxalic acid, a lactic acid, a malic acid, a citric acid, and the like. The pH of the acid solution is preferably 0 to 4, and more preferably 1 to 3. It is preferable that the concentration of the dilute hydrochloric acid is 0.001% to 0.5%, the concentration of the dilute sulfuric acid is 0.001% to 0.5%, the concentration of the dilute nitric acid is 0.001% to 0.5%, and the concentration of the organic acid is 0.1% to 1%. By preparing the acid solution in a corresponding one of the above-described ranges, the surface roughness of the InP substrate can be further reduced.

In the washing step (S40), it is preferable that an oxidizer is added to the acid solution. The oxidizer is not particularly limited but, for example, may be a hydrogen peroxide solution and the like. The surface of the InP wafer is washed using an acid solution added with an oxidizer, so that the rate of the washing step can be raised. Although the concentration of the oxidizer is not particularly limited, for example, the concentration is preferably 0.5 ppm or more and 10 ppm or less, and more preferably 1 ppm or more and 5 ppm or less. An oxidizer having a concentration of 0.5 ppm or more can suppress a decrease in the washing performance of the acid solution. An oxidizer having a concentration of 10 ppm or lower can prevent reaction with the oxide, the organic substance, the particles or the like on the surface of the InP wafer.

Although not particularly limited, the temperature of the acid solution used in the washing step (S40) is preferably set at a room temperature. At such a room temperature, the equipment used for surface-treating the InP wafer can be simplified.

Although not particularly limited, the washing time is preferably set at 10 seconds or more and 300 seconds or less, for example. When the washing step (S40) is carried out within such a range, the cost for the acid solution can be reduced while the productivity can be improved. In addition, after the above-mentioned washing step, a pure water rinsing step may be carried out in order to remove a washing solution such as an acid or an alkaline solution. Furthermore, after the pure water rinsing step performed after the final washing step, the moisture in the InP wafer is removed by centrifugal drying or the like. During this pure water rinsing step, an ultrasonic wave of 900 kHz to 2000 kHz is applied, so that adhesion of particles can be prevented. Also, during pure water rinsing, pure water having been degassed to an oxygen concentration of 100 ppb or lower is used for preventing oxidation of the surface of the InP wafer. Through the above-described steps, an InP substrate is produced from the InP wafer.

Fourth Embodiment

An epitaxial wafer in the present embodiment will be hereinafter described. The epitaxial wafer includes an InP substrate in the first embodiment, and an epitaxial film formed on the first main surface of the InP substrate. The number of epitaxial films to be layered may be one, or may be more than one.

At the interface between the InP substrate and the epitaxial film, for example, the Si concentration is $1.8 \times 10^{17}$ atoms/cm$^3$ or lower, and the S concentration is $2 \times 10^{13}$ atoms/cm$^3$ or lower.

Then, a method of producing an epitaxial wafer in the present embodiment will be hereinafter described. First, an InP substrate is produced according to the third embodiment.

An epitaxial film is formed on the surface of the InP substrate. The method of forming an epitaxial film is not particularly limited, but may be an organo metallic vapor phase epitaxy (OMVPE) method, a hydride vapor phase epitaxy (HVPE) method, a molecular beam epitaxy (MBE) method, and the like.

In addition, in order to divide the InP substrate into individual elements after forming an epitaxial film having a prescribed structure on the first main surface of the InP substrate, for example, a dividing step including dicing and the like may be performed.

By performing the above-described steps, an epitaxial wafer can be produced.

The epitaxial wafer produced in this way is mounted, for example, on a lead frame or the like. Then, a wire bonding step and the like are performed, so that a semiconductor device made using the above-mentioned elements can be obtained.

The method of producing an epitaxial wafer in the present embodiment is carried out using InP substrate 10 in the first embodiment. Accordingly, an epitaxial wafer having less deteriorated PL characteristics can be produced.

In such an epitaxial wafer, when the InP substrate contains a dopant made of at least one kind of substances selected from the group consisting of Fe, S, Sn, and Zn, the following effects are achieved.

When the dopant is Fe, for example, the epitaxial wafer has a dopant concentration of $1 \times 10^{16}$ atoms/cc or more and $1 \times 10^{17}$ atoms/cc, and also has a semi-insulating electrical characteristics. In this case, when the concentrations of Si and S are high at the interface between the InP substrate and the epitaxial layer, the electrical characteristics become abnormal (occurrence of leakage). However, in the present embodiment, the concentrations of Si and S can be decreased at the interface between the InP substrate and the epitaxial layer. Accordingly, the epitaxial wafer is suitably used for a high electron mobility transistor (HEMT), a heterojunction bipolar transistor (HBT), and the like.

When the dopant is S, for example, the epitaxial wafer has a dopant concentration of $0.5 \times 10^{18}$ atoms/cc or more and $8 \times 10^{18}$ atoms/cc, and also has n-type electrical characteristics. In this case, when the concentrations of O and C are high at the interface between the InP substrate and the epitaxial film, the electrical characteristics become abnormal and the light emission intensity is lowered. However, in the present embodiment, since the concentrations of O and C can be lowered at the interface between the InP substrate and the epitaxial layer, the epitaxial wafer is suitably used for a laser and the like. Furthermore, when haze can be reduced, the light emission intensity of the epitaxial wafer can be further improved.

When the dopant is Sn, for example, the epitaxial wafer has a dopant concentration of $1 \times 10^{18}$ atoms/cc or more and $6 \times 10^{18}$ atoms/cc, and also has n-type electrical characteristics. In this case, when the concentrations of O and C are high at the interface between the InP substrate and the epitaxial film, the electrical characteristics become abnormal and the light emission intensity is lowered. However, in the present embodiment, since the concentrations of O and C can be lowered at the interface between the InP substrate and the epitaxial layer, the epitaxial wafer is suitably used for a LD and the like. Furthermore, when haze can be reduced, the light emission intensity of the epitaxial wafer can be further improved.

When the dopant is Zn, for example, the epitaxial wafer has a dopant concentration of $3 \times 10^{18}$ atoms/cc or more and $8 \times 10^{18}$ atoms/cc, and also has p-type electrical characteristics. In this case, when the concentrations of Si and S are high at the interface between the InP substrate 10 and the epitaxial film, the electrical characteristics become abnormal and the light emission intensity is lowered. However, in the present embodiment, since the concentrations of Si and S can be lowered at the interface between the InP substrate and the epitaxial layer, the epitaxial wafer is suitably used for a LD and the like. Furthermore, when haze can be reduced, the light emission intensity of the epitaxial wafer can be further improved.

EXAMPLES

Then, the present invention will be hereinafter further specifically described with reference to Examples. It is to be noted that the present invention is not limited to these Examples.

Production Examples A to L (Production of InP Substrate)

First, an InP single crystal was grown in the [100] direction using a Vertical Bridgeman (VB) method to thereby obtain an InP ingot. Then, the InP ingot was sliced to obtain an InP wafer having a main surface that was off at 2° from the (100) direction to the [110] direction. The InP wafer was formed in a disc shape having a diameter of 153 mm and a thickness of 780 μm.

Then, both of the main surfaces of the InP wafer were polished using a double-side polishing apparatus (surface plate size of 750 mm). A polishing cloth obtained by impregnating a nonwoven fabric base material with polyurethane resin (SubaIV manufactured by Nitta Haas Incorporated) was used. In addition, the polishing cloth was subjected in advance to dressing with diamond pellets (Padless 200H manufactured by Fujimi Incorporated). Also, "(a) Double-Side Polishing Conditions" shown in Table 1 are specifically as follows.

Normal: the upper surface plate is rotated at a rotation speed of 8 rpm (forward rotation direction); the lower surface plate is rotated at a rotation speed of 24 rpm (forward rotation direction); and the internal gear is rotated at a rotation speed of 7 rpm (forward rotation direction); and the sun gear is rotated at a rotation speed of 11 rpm (forward rotation direction), to apply a load at a surface pressure of 100 g/cm$^2$, thereby polishing the surfaces while supplying a polishing agent (for example, "INSEC IPP" manufactured by Fujimi incorporated) at a flow rate of 300 ml/min.

Changed: double-side polishing is performed under the above-described normal conditions until 7/10 of the machining allowance of double-side polishing. Then, the rotation speed is lowered to 50% of the normal rotation speed, to lower the polishing rate to 1/3, at which rate the remaining 3/10 of the machining allowance is double-side polished.

Also, "(a-1) Surface Active Agent" shown in Table 1 is specifically as follows.

Used: under the above-described (a) Double-Side Polishing Conditions, when the remaining 3/10 of the thickness of the machining allowance is polished, double-side polishing is performed while supplying a surface active agent (NCW 1001 manufactured by Wako Pure Chemical Industries, Ltd.) together with a polishing liquid at a fixed flow rate.

Not Used: a surface active agent is not used under the above-described (a) Double-Side Polishing Conditions.

Also, "(a-2) Machining Allowance (μm)" shown in Table 1 indicates a thickness of the machining allowance.

Then, one side (corresponding to the first main surface) of the double-side polished InP wafer was polished using a single-side polishing apparatus (a surface plate size of 830 mm). A nonwoven fabric (CIEGAL PS8410 manufactured by Chiyoda Co., Ltd.) was used as a polishing cloth, and a finish polishing agent (INSEC SP manufactured by Fujimi Incorporated) was used as a polishing agent. Also, "(b) Single-Side Finish Polishing Conditions" shown in Table 1 are specifically as follows.

Normal: the lower surface plate is rotated at a rotation speed of 60 rpm (forward rotation direction); and the upper surface plate is rotated at a rotation speed of 60 rpm (forward rotation direction), to apply a load at a surface pressure of 80 g/cm$^2$, thereby polishing the surfaces while supplying a polishing agent (for example, "INSEC SP" manufactured by Fujimi Incorporated) at a flow rate of 140 ml/min. The machining allowance for single-side finish polishing is about 1 μm.

Changed: single-side polishing is performed under the above-described normal conditions until 9/10 of the machining allowance for single-side finish polishing. Then, the rotation speed is lowered to 50% of the normal rotation speed, to lower the polishing rate to ½, at which rate the remaining 1/10 of the machining allowance is single-side polished.

Also, "(b-1) Surface Active Agent" shown in Table 1 is specifically as follows.

Used: when the remaining 1/10 of the thickness of the machining allowance is polished under the above-described (b) single-side finish polishing conditions, double-side polishing is performed while supplying a surface active agent (NCW 1001 manufactured by Wako Pure Chemical Industries, Ltd.) together with a polishing liquid at a fixed flow rate.

Not Used: a surface active agent is not used under the above-described (b) single-side finish polishing conditions.

Then, after the InP wafer was washed with 0.1% of hydrogen fluoride, the InP wafer was rinsed with ultrapure water containing 50 ppb of dissolved oxygen, and then dried by an IPA steam dryer. Thereby, InP substrates in Production Examples A to L were obtained.

(Measurement of InP Substrates)

For each of the obtained InP substrates, each of surface roughnesses Ra1 to Ra10 was measured in a view of 0.2 μm square at a center position on each substrate and at four positions on each substrate that were located at a distance of 5 mm inwardly from the outer edge of each substrate, as shown in FIGS. 3 and 4. Specifically, for the first main surface and the second main surface of each InP substrate, a surface roughness was measured using an AFM apparatus ("Dimension3000" manufactured by Veeco) at a 0.40-nm pitch at each position and for 512 lines (512 samples per line). In this case, a tapping mode was used. From the measured values of the surface roughnesses, average values m1 and m2 and standard deviations σ1, σ2, σ1/m1, σ2/m2 of the surface roughnesses were calculated. The results thereof are shown in Table 1.

(Formation of Epitaxial Film)

On the first main surface of the obtained InP substrate, an InP film having a thickness of 300 nm was formed by the OMVPE method. On this InP film, an InGaAs film having a thickness of 5 nm was formed by the OMVPE method. On this InGaAs film, an InP film having a thickness of 300 nm was formed by the OMVPE method. Thereby, an epitaxial wafer having an epitaxial film formed on the InP substrate was produced. The InP substrate temperature during formation of the epitaxial film was 580° C.

<Evaluations>

For each of the epitaxial wafers in production examples A to L, the PL intensity of the InGaAs film was measured. This PL measurement was performed using a semiconductor LD with an excitation light wavelength of 532 nm under the conditions, for example, with an irradiation beam diameter of 100 μm, at a measurement temperature of 25° C., and at an excitation light intensity of 300 mW. The measured wavelength range was 1250 nm to 1500 nm corresponding to the light emission wavelength from the InGaAs layer. The PL intensity was defined as the peak intensity of the light emission wavelength. The measuring machine was PLM150 manufactured by Nanometrics Inc. The results thereof are shown in Table 1.

TABLE 1

| | Samples | | A | B | C | D | E | F |
|---|---|---|---|---|---|---|---|---|
| Polishing Conditions | (a) Double-Side Polishing Conditions | | Changed | Changed | Normal | Normal | Changed | Changed |
| | (a-1) Surface Active Agent | | Used | Not Used | Not Used | Not Used | Used | Not Used |
| | (a-2) Machining Allowance (μm) | | 40 | 40 | 40 | ≤5 | 40 | 40 |
| | (b) Single-Side Finish Polishing Conditions | | Changed | Changed | Changed | Changed | Changed | Changed |
| | (b-1) Surface Active Agent | | Used | Used | Used | Used | Not Used | Not Used |
| First Main Surface | Surface Roughness (nm) | 1 | 0.212 | 0.221 | 0.245 | 0.211 | 0.321 | 0.345 |
| | | 2 | 0.234 | 0.201 | 0.253 | 0.231 | 0.331 | 0.319 |
| | | 3 | 0.245 | 0.232 | 0.241 | 0.229 | 0.318 | 0.322 |
| | | 4 | 0.233 | 0.218 | 0.225 | 0.234 | 0.305 | 0.331 |
| | | 5 | 0.201 | 0.197 | 0.222 | 0.211 | 0.315 | 0.311 |
| | | m1 | 0.225 | 0.214 | 0.237 | 0.223 | 0.303 | 0.326 |
| | | σ1 | 0.018 | 0.015 | 0.013 | 0.011 | 0.009 | 0.013 |
| | σ1/m1 | | 0.080 | 0.068 | 0.056 | 0.051 | 0.031 | 0.040 |
| Second Main Surface | Surface Roughness (nm) | 6 | 0.264 | 0.899 | 2.5 | 4.539 | 0.265 | 1.001 |
| | | 7 | 0.281 | 0.912 | 2.581 | 4.339 | 0.262 | 0.977 |
| | | 8 | 0.273 | 0.858 | 2.591 | 4.459 | 0.288 | 0.991 |
| | | 9 | 0.269 | 0.928 | 2.555 | 4.389 | 0.259 | 0.967 |
| | | 10 | 0.251 | 0.949 | 2.541 | 4.539 | 0.249 | 0.948 |
| | | m2 | 0.268 | 0.909 | 2.554 | 4.453 | 0.265 | 0.977 |
| | | σ2 | 0.011 | 0.034 | 0.036 | 0.089 | 0.014 | 0.021 |
| | σ2/m2 | | 0.042 | 0.038 | 0.014 | 0.020 | 0.054 | 0.021 |
| | m1/m2 | | 0.896 | 0.225 | 0.093 | 0.049 | 1.217 | 0.343 |
| | σ1/σ2 | | 1.608 | 0.426 | 0.369 | 0.126 | 0.655 | 0.628 |

TABLE 1-continued

| Evaluations | | | | | | | |
|---|---|---|---|---|---|---|---|
| | PL Intensity (au) | 1 | 0.95 | 0.9 | 0.2 | 0.8 | 0.7 |
| | PL Intensity Standard Deviation | 0.03 | 0.03 | 0.08 | 0.2 | 0.04 | 0.04 |

| | | Samples | G | H | I | J | K | L |
|---|---|---|---|---|---|---|---|---|
| Polishing Conditions | (a) Double-Side Polishing Conditions | | Normal | Normal | Changed | Changed | Normal | Normal |
| | (a-1) Surface Active Agent | | Not Used | Not Used | Used | Not Used | Not Used | Not Used |
| | (a-2) Machining Allowance (μm) | | 40 | ≤5 | 40 | 40 | 40 | ≤5 |
| | (b) Single-Side Finish Polishing Conditions | | Changed | Changed | Normal | Normal | Normal | Normal |
| | (b-1) Surface Active Agent | | Not Used | Not Used | Not Used | Not Used | Not Used | Not Used |
| First Main Surface | Surface Roughness (nm) | 1 | 0.319 | 0.318 | 0.477 | 0.541 | 0.487 | 0.504 |
| | | 2 | 0.331 | 0.349 | 0.465 | 0.501 | 0.469 | 0.481 |
| | | 3 | 0.328 | 0.331 | 0.488 | 0.479 | 0.471 | 0.469 |
| | | 4 | 0.341 | 0.319 | 0.491 | 0.497 | 0.481 | 0.481 |
| | | 5 | 0.308 | 0.311 | 0.465 | 0.489 | 0.491 | 0.465 |
| | | m1 | 0.325 | 0.326 | 0.477 | 0.501 | 0.480 | 0.480 |
| | | σ1 | 0.013 | 0.015 | 0.012 | 0.024 | 0.010 | 0.015 |
| | σ1/m1 | | 0.038 | 0.046 | 0.026 | 0.047 | 0.020 | 0.032 |
| Second Main Surface | Surface Roughness (nm) | 6 | 2.661 | 4.889 | 0.244 | 0.889 | 2.912 | 5.012 |
| | | 7 | 2.889 | 4.919 | 0.265 | 0.984 | 2.661 | 5.004 |
| | | 8 | 2.871 | 5.012 | 0.251 | 0.899 | 3.011 | 4.981 |
| | | 9 | 2.691 | 4.887 | 0.259 | 0.912 | 2.871 | 5.015 |
| | | 10 | 2.512 | 4.891 | 0.239 | 0.868 | 2.671 | 4.891 |
| | | m2 | 2.725 | 4.920 | 0.252 | 0.910 | 2.825 | 4.981 |
| | | σ2 | 0.157 | 0.053 | 0.011 | 0.044 | 0.154 | 0.052 |
| | σ2/m2 | | 0.058 | 0.011 | 0.042 | 0.049 | 0.055 | 0.010 |
| | m1/m2 | | 0.130 | 0.067 | 1.997 | 0.578 | 0.180 | 0.098 |
| | σ1/σ2 | | 0.080 | 0.280 | 1.158 | 0.536 | 0.063 | 0.293 |
| Evaluations | PL Intensity (au) | | 0.6 | 0.2 | 0.4 | 0.35 | 0.3 | 0.2 |
| | PL Intensity Standard Deviation | | 0.08 | 0.2 | 0.06 | 0.06 | 0.08 | 0.2 |

<Evaluation Results>

As to the first main surface in each of production examples A to C and E to G, an average value m1 of the surface roughnesses is 0.4 nm or less, and a standard deviation σ1 of the surface roughnesses is 10% or less of average value m1. As to the second main surface in each of production examples A to C and E to G, an average value m2 of the surface roughnesses is 0.2 nm or more and 3 nm or less, and a standard deviation σ2 of the surface roughnesses is 10% or less of average value m2. In each of these production examples, the surface roughnesses on each of the front and rear surfaces of the substrate are controlled in a plane, so that the substrate temperature during epitaxial growth becomes uniform in a plane, thereby achieving an epitaxial growth film having excellent PL characteristics.

In production examples D, H, and L, average value m2 of the surface roughnesses on the second main surface exceeds 4.4 nm, and the surface roughnesses on each of the front and rear surfaces of the substrate are insufficiently controlled. Thus, the substrate temperature during epitaxial growth does not become sufficiently uniform in a plane, thereby leading to an epitaxial growth film having inferior PL characteristics.

In production examples I, J and K, average value m1 of the surface roughnesses on the first main surface exceeds 0.4 nm, and the epitaxial growth film is inferior in PL characteristics.

It should be understood that the embodiments and the examples disclosed herein are illustrative and non-restrictive in every respect. The scope of the present invention is defined by the terms of the claims, rather than the description of the embodiments provided above, and is intended to include any modifications within the meaning and scope equivalent to the terms of the claims.

INDUSTRIAL APPLICABILITY

The indium phosphide substrate of the present invention is beneficial when it is used for a semiconductor LD, an LED, a luminous flux device, and the like.

REFERENCE SIGNS LIST 10 indium phosphide substrate, 11 first main surface, 12 second main surface, 60 double-side polishing apparatus, 61 upper surface plate, 62 lower surface plate, 63 polishing cloth, 64 polishing liquid introducing hole, 70 single-side polishing apparatus, 74 InP wafer, 75 polishing liquid, 76 second polishing cloth, 77 polishing surface plate, 78 rotation shaft, 79 polishing liquid supply tube, 720 polishing head, 722 shaft.

The invention claimed is:

1. An indium phosphide substrate having a first main surface and a second main surface,
   the first main surface having a surface roughness Ra1 at a center position and surface roughnesses Ra2, Ra3, Ra4, and Ra5 at four positions, the four positions being arranged equidistantly along an outer edge of the first main surface and located at a distance of 5 mm inwardly from the outer edge,
   an average value m1 of the surface roughnesses Ra1, Ra2, Ra3, Ra4, and Ra5 being 0.4 nm or less,
   a standard deviation σ1 of the surface roughnesses Ra1, Ra2, Ra3, Ra4, and Ra5 being 10% or less of the average value m1, the second main surface having a surface roughness Ra6 at a center position and surface roughnesses Ra7, Ra8, Ra9, and Ra10 at four positions, the four positions being arranged equidistantly along an outer edge of the second main surface and located at a distance of 5 mm inwardly from the outer edge, an average value m2 of the surface roughnesses Ra6, Ra7, Ra8, Ra9, and Ra10 being 0.2 am or more and 3 am or less, and a standard deviation σ2 of the surface roughnesses Ra6, Ra7, Ra8, Ra9, and Ra10 being 10% or less of the average value m2.

2. The indium phosphide substrate according to claim 1, wherein the indium phosphide substrate has a maximum diameter of 150 mm or more.

3. A method of producing an indium phosphide substrate according to claim 1, the method comprising:

preparing an indium phosphide wafer having a first main surface and a second main surface;

double-side polishing the first main surface and the second main surface of the indium phosphide wafer using a first polishing cloth;

single-side finish polishing the first main surface of the double-side polished indium phosphide wafer using a second polishing cloth; and washing the single-side finish polished indium phosphide wafer.

* * * * *

UNITED STATES PATENT AND TRADEMARK OFFICE
CERTIFICATE OF CORRECTION

PATENT NO. : 10,473,445 B2
APPLICATION NO. : 15/541754
DATED : November 12, 2019
INVENTOR(S) : Shinya Fujiwara et al.

It is certified that error appears in the above-identified patent and that said Letters Patent is hereby corrected as shown below:

In the Claims

At Column 19, Claim number 1, Line number 8, "0.2 am or more and 3 am" should read --0.2 nm or more and 3 nm--.

Signed and Sealed this
Eleventh Day of February, 2020

Andrei Iancu
*Director of the United States Patent and Trademark Office*